United States Patent
Cheng et al.

(10) Patent No.: US 10,256,328 B2
(45) Date of Patent: Apr. 9, 2019

(54) DUMMY DIELECTRIC FINS FOR FINFETS WITH SILICON AND SILICON GERMANIUM CHANNELS

(71) Applicant: INTERNATIONAL BUSINESS MACHINES CORPORATION, Armonk, NY (US)

(72) Inventors: Kangguo Cheng, Schnectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/157,917

(22) Filed: May 18, 2016

(65) Prior Publication Data

US 2017/0338322 A1 Nov. 23, 2017

(51) Int. Cl.
*H01L 27/12* (2006.01)
*H01L 29/06* (2006.01)
(Continued)

(52) U.S. Cl.
CPC ...... *H01L 29/6681* (2013.01); *H01L 21/0262* (2013.01); *H01L 21/02236* (2013.01);
(Continued)

(58) Field of Classification Search
CPC ..... H01L 21/823821; H01L 21/823878; H01L 21/845; H01L 27/0924; H01L 27/1211; H01L 29/6681; H01L 21/823431; H01L 27/0886; H01L 27/10826; H01L 27/10879; H01L 29/41791;
(Continued)

(56) References Cited

U.S. PATENT DOCUMENTS 6,943,405 B2 9/2005 Bryant et al.
8,993,399 B2 3/2015 Cheng et al.
(Continued)

OTHER PUBLICATIONS

Nowak, E.J., "2nd-Generation FinFETs and Fins on Oxide" Fully Depleted Transistors Technology Symposium, San Francisco (Dec. 2012) 23 slides.
US Office Action issued in U.S. Appl. No. 15/353,314, dated Feb. 14, 2018, pp. 1-33.

*Primary Examiner* — Kevin Parendo
(74) *Attorney, Agent, or Firm* — Tutunjian & Bitetto, P.C.; Vazken Alexanian

(57) ABSTRACT

A method for forming a semiconductor device includes forming first fins from a first semiconductor material and second fins from a second semiconductor material and encapsulating the first fins and the second fins with a protective dielectric. Semiconductor material between the first fins and the second fins is etched to form trenches. A dielectric fill is employed to fill up the trenches, between the first fins and between the second fins. The first semiconductor material below the first fins and the second semiconductor material below the second fins are oxidized with the first and second fins being protected by the protective dielectric. Fins in an intermediary region between the first fins and the second fins are oxidized to form dummy fins in the intermediary region to maintain a substantially same topology across the device.

14 Claims, 13 Drawing Sheets

(51) Int. Cl.
*H01L 29/66* (2006.01)
*H01L 27/092* (2006.01)
*H01L 29/161* (2006.01)
*H01L 21/8238* (2006.01)
*H01L 29/165* (2006.01)
*H01L 21/84* (2006.01)
*H01L 21/02* (2006.01)

(52) U.S. Cl.
CPC .. *H01L 21/02238* (2013.01); *H01L 21/02532* (2013.01); *H01L 21/02598* (2013.01); *H01L 21/823807* (2013.01); *H01L 21/823821* (2013.01); *H01L 21/823878* (2013.01); *H01L 21/845* (2013.01); *H01L 27/0924* (2013.01); *H01L 27/1211* (2013.01); *H01L 29/0649* (2013.01); *H01L 29/161* (2013.01); *H01L 29/165* (2013.01); *H01L 29/66795* (2013.01); *H01L 29/66818* (2013.01)

(58) Field of Classification Search
CPC ................... H01L 29/66795–29/66818; H01L 29/785–29/7856; H01L 2924/13067
See application file for complete search history.

(56) References Cited

U.S. PATENT DOCUMENTS

| | | | |
|---|---|---|---|
| 9,093,496 | B2 | 7/2015 | Jacob et al. |
| 9,147,616 | B1* | 9/2015 | Jacob ................ H01L 27/0886 |
| 9,202,917 | B2 | 12/2015 | Ching et al. |
| 9,209,202 | B2 | 12/2015 | Ponoth et al. |
| 9,214,557 | B2 | 12/2015 | Tan et al. |
| 9,224,865 | B2 | 12/2015 | Akarvardar et al. |
| 2014/0117454 | A1 | 5/2014 | Liu et al. |
| 2014/0145248 | A1* | 5/2014 | Cheng ............... H01L 21/02227 257/288 |
| 2014/0353760 | A1* | 12/2014 | Loubet ........... H01L 21/823821 257/369 |
| 2015/0001591 | A1 | 1/2015 | Akarvardar et al. |
| 2015/0028398 | A1* | 1/2015 | Cheng .................. H01L 29/785 257/288 |
| 2015/0028454 | A1* | 1/2015 | Cheng .................. H01L 29/785 257/616 |
| 2015/0179767 | A1 | 6/2015 | Wang et al. |
| 2016/0005738 | A1* | 1/2016 | Liu .................... H01L 27/0924 257/369 |
| 2017/0040324 | A1 | 2/2017 | Yang et al. |

* cited by examiner

DUMMY DIELECTRIC FINS FOR FINFETS WITH SILICON AND SILICON GERMANIUM CHANNELS

BACKGROUND

Technical Field

The present invention generally relates to semiconductor processing, and more particularly to devices and methods for forming fin field effect transistors (finFETs) with dummy dielectric fins to improve downstream processing.

Description of the Related Art

Fin field effect transistors (finFETs) have satisfied the ever decreasing node size problem for semiconductor processing and have become a technology employed for 22 nm nodes and beyond. To further improve finFET performance, particularly for mainstream bulk finFETs, two paths are being pursued. One path employs SiGe fins to boost p-type FET (PFET) performance, and another path employs better isolation for junction isolation. Two process issues include difficulty in cutting dummy fins and fin induced topography, which causes patterning challenges in downstream processing such as gate patterning.

SUMMARY

In accordance with an embodiment of the present principles, a method for forming a semiconductor device includes forming first fins from a first semiconductor material and second fins from a second semiconductor material and encapsulating the first fins and the second fins with a protective dielectric. Semiconductor material between the first fins and the second fins is etched to form trenches. A dielectric fill is employed to fill up the trenches, between the first fins and between the second fins. The first semiconductor material below the first fins and the second semiconductor material below the second fins are oxidized with the first and second fins being protected by the protective dielectric. Fins in an intermediary region between the first fins and the second fins are oxidized to form dummy fins in the intermediary region to maintain a substantially same topology across the device.

Another method for forming a semiconductor device includes etching a portion of a semiconductor substrate, the substrate including a first semiconductor material; growing a second semiconductor material in a trench formed by removing the portion; etching first fins in the first semiconductor material and second fins in the second semiconductor material in accordance with a dielectric mask; forming spacers on sidewalls of the dielectric mask and the first fins and the second fins to encapsulate the first fins and the second fins with a protective dielectric; etching semiconductor material between the first fins and the second fins to form trenches; filling the trenches, between the first fins and between the second fins with a dielectric fill; oxidizing the first semiconductor material below the first fins and the second semiconductor material below the second fins such that the first and second fins are protected by the protective dielectric; and oxidizing fins in an intermediary region between the first fins and the second fins to form dummy fins in the intermediary region to maintain a substantially same topology across the device.

A semiconductor device includes first fins formed from a first semiconductor material in a first region and second fins formed from a second semiconductor material in a second region. An intermediary region is disposed between the first region and the second region. A plurality of a dummy fins are disposed in the intermediary region and include dummy fins configured to maintain a fin topology across the intermediary region. A shallow trench isolation region is formed beneath the first fins, the second fins and the dummy fins.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
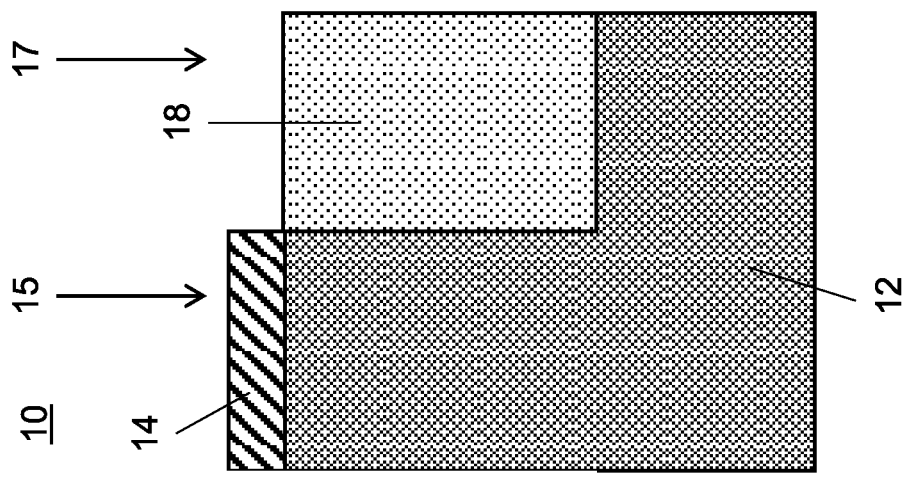
FIG. 1 is a cross-sectional view showing a substrate and a pad dielectric layer thereon in accordance with an embodiment of the present principles.

In accordance with the present principles, methods and structures are provided for forming dielectric-isolated Si and SiGe fins on a same chip and concurrently forming dummy dielectric fins to improve the topography for downstream processing. In one embodiment, the dummy dielectric fins are formed by a two-step oxidation process and remain in a final structure. Dummy oxide fins are formed from semiconductor fins and an oxide isolation is formed beneath the fins. The dummy oxide fins and the oxide isolation are formed concurrently during processing. The dummy oxide fins form a region that separates n-type devices from p-type devices in a complementary metal oxide semiconductor (CMOS) device. In addition, the dummy oxide fins alleviate topography issues between Si and SiGe fins and facilitate downstream processing such as gate patterning, planarization (chemical mechanical polishing (CMP)), etc. For example, CMP processing can be avoided as well as other processes since the dummy oxide structures alleviate topography issues.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a device 10 is fabricated in accordance with the present principles. Device 10 includes a substrate 12. The substrate 12 in the embodiment shown and described includes a bulk substrate although other substrate structures may be employed, e.g., a semiconductor on insulator (SOI) substrate. The substrate 12 includes a semiconductor material and preferably includes Si or strained Si, although other materials e.g., SiC, SiGe, SiGeC, Si alloys, Ge, Ge alloys, etc. or any combination thereof, may be employed.

A pad dielectric layer 14 may be formed on the substrate 12. The pad dielectric layer 14 may be grown or formed by implanting a high-energy dopant into the bulk semiconductor substrate 12 and then annealing the structure to form pad dielectric layer 14. In another embodiment, the pad dielectric layer 14 may be deposited. The pad dielectric layer 14 may include a nitride, an oxynitride, a different dielectric material or a combination of one or more of these or other materials.

Figure 2:
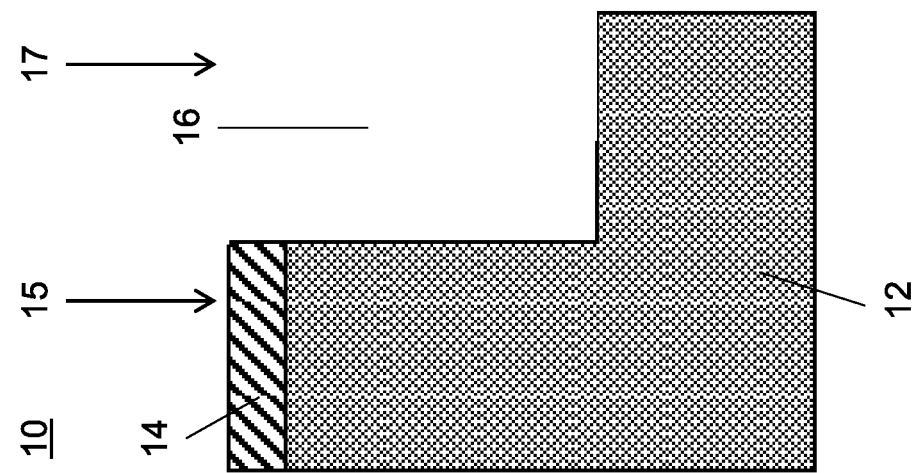
FIG. 2 is a cross-sectional view showing a device of FIG. 1 having a region removed by etching in accordance with an embodiment of the present principles.

Referring to FIG. 2, the substrate 12 is masked and etched to form a recessed region 16. The recessed region 16 covers an area where a different substrate material will be deposited or grown. For example, region 15 includes a first material to be employed for a first type of device and region 17 will include a second material to be used for a second type of device. In one embodiment, the first material in region 15 includes Si, and the second material to be formed in region 17 will include SiGe. Si can be employed for NFET devices while SiGe can be employed for PFET devices.

Figure 3:
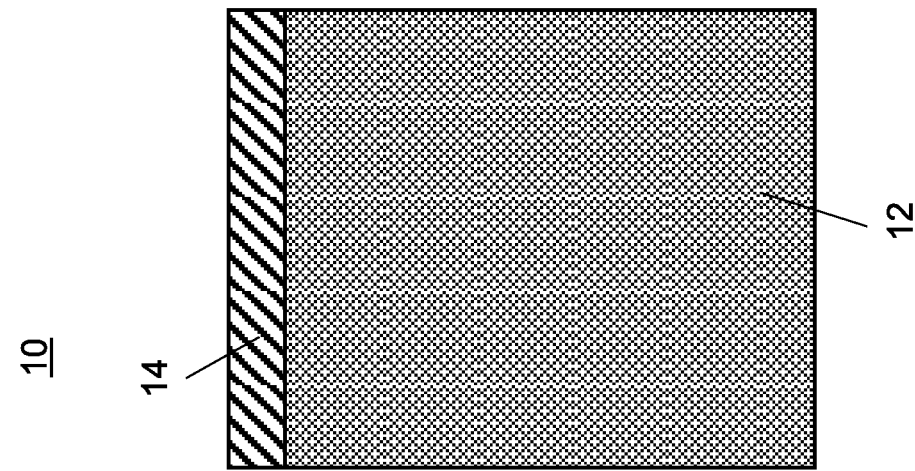
FIG. 3 is a cross-sectional view showing the device of FIG. 2 having the region filled with an epitaxially grown material in accordance with an embodiment of the present principles.

Referring to FIG. 3, a material 18 is grown in recessed region 16. In the embodiment described, the material 18 includes SiGe, which is epitaxially grown. Epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. The SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 4:
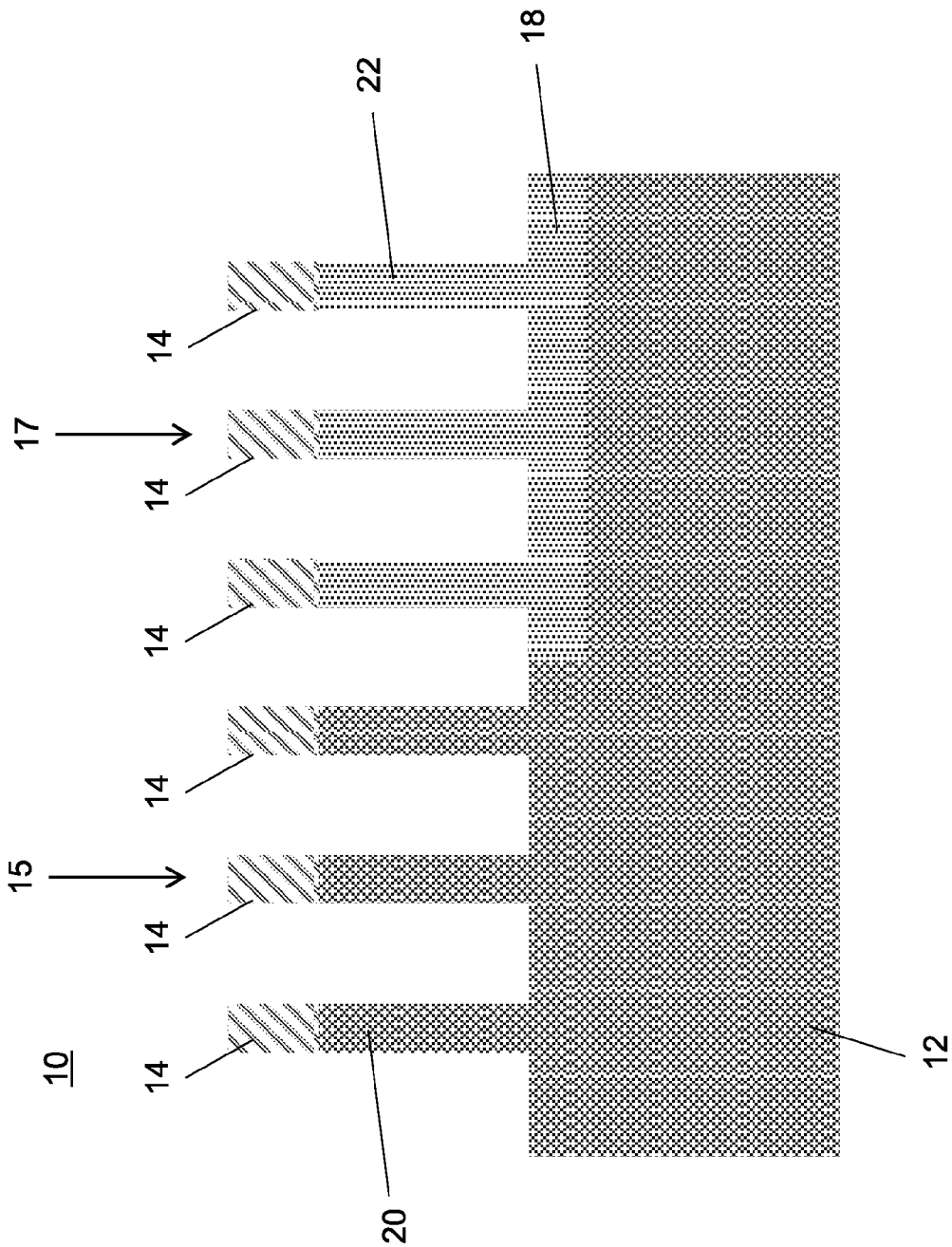
FIG. 4 is a cross-sectional view showing the device of FIG. 3 having fins etched from different materials in accordance with an embodiment of the present principles.

Referring to FIG. 4, a pad dielectric 14 is formed over the semiconductor material 18. In one embodiment, the original pad dielectric 14 is stripped, and a new pad dielectric 14 is formed over the entire semiconductor surface. In another embodiment, the original pad dielectric 14 is kept, and the new pad dielectric is formed over the semiconductor 18. The pad dielectric 14 and the underlying semiconductors are patterned (e.g., using a sidewall imaging transfer (SIT) process) and etched (e.g., by a reactive ion etch (RIE) process) to form fins 20 and 22 in respective regions 15 and 17. The fins 20 and 22 may be formed from the substrate 12 and material 18 in the respective regions 15 and 17.

Figure 5:
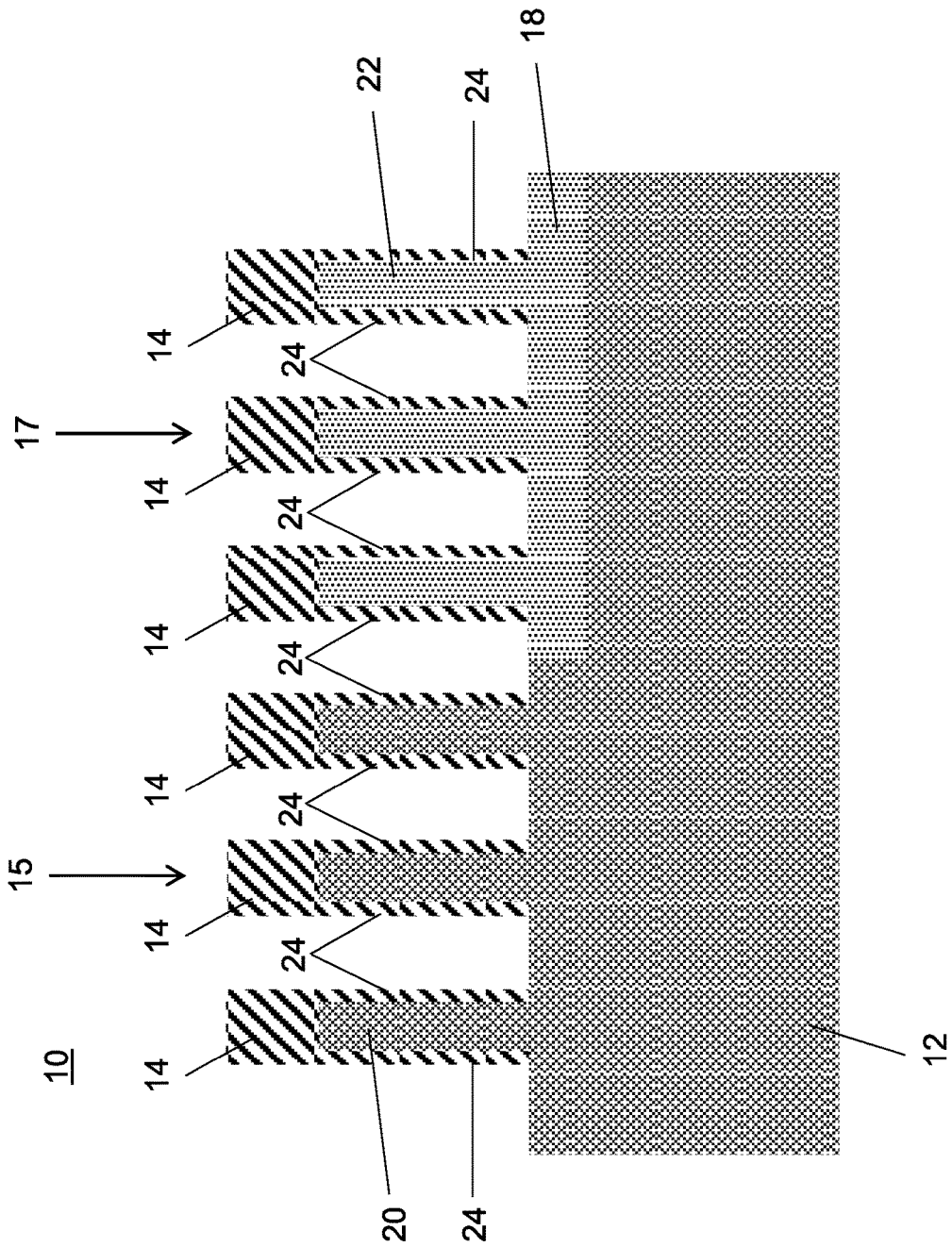
FIG. 5 is a cross-sectional view showing the device of FIG. 4 having fins encapsulated by spacers and a cap dielectric in accordance with an embodiment of the present principles.

Referring to FIG. 5, a spacer layer is conformally deposited over the device 10 followed by a RIE to remove the spacer layer from horizontal surfaces and form spacers 24. The spacers 24 may include a same material as the pad dielectric 14. Alternatively, the spacers 24 may include a material different from the pad dielectric 14. In one embodiment, the spacers 24 include a nitride, oxynitride or other suitable dielectric material or combinations thereof. The spacers 24 cover sidewalls of the fins 20, 22.

Figure 6:
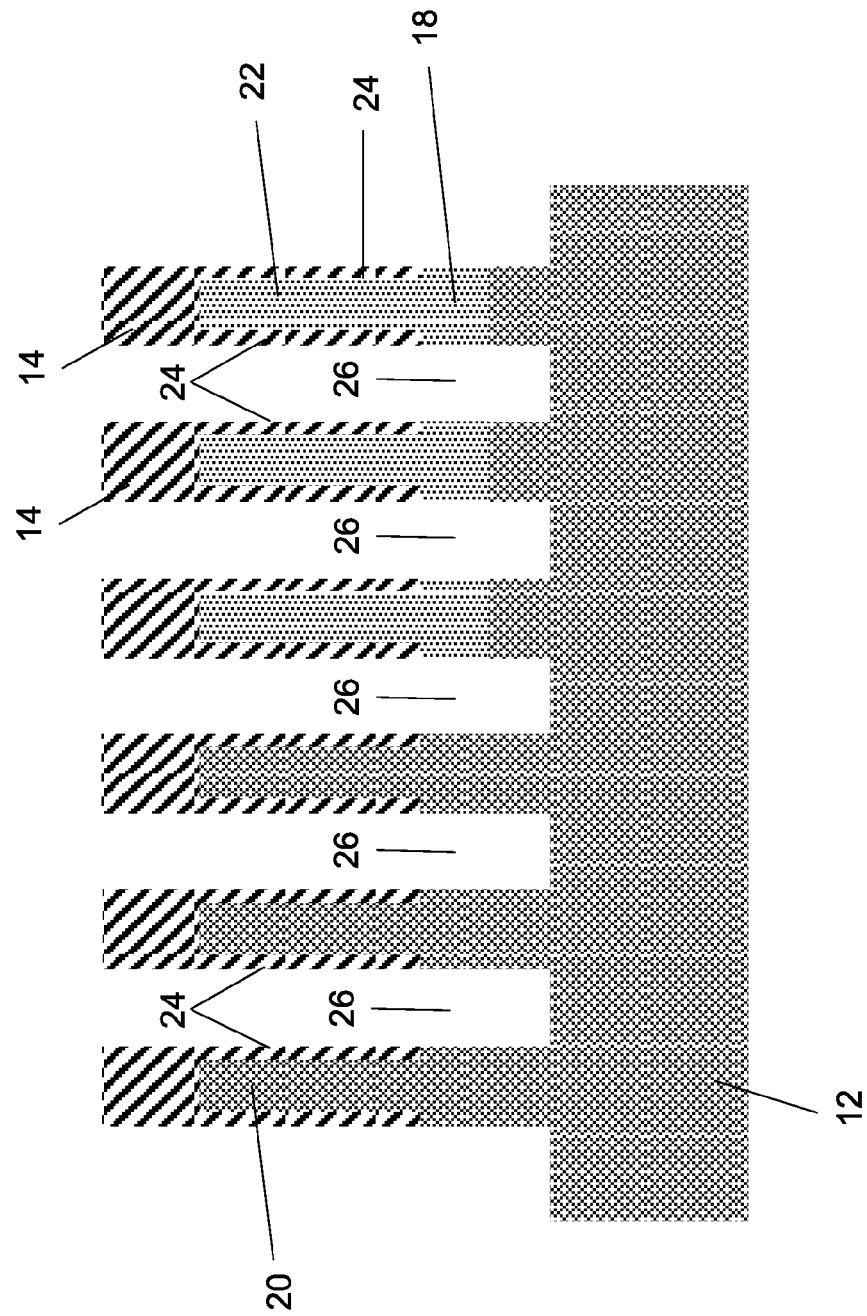
FIG. 6 is a cross-sectional view showing the device of FIG. 5 having the encapsulated fins employed as an etch mask to extend trenches into the substrate and epitaxially grown material in accordance with an embodiment of the present principles.

Referring to FIG. 6, the RIE is continued to form trenches 26 between fins 20, 22. This is achieved by etching to remove substrate 12 material between fins 20, and material 18 and substrate 12 between fins 22.

Figure 7:
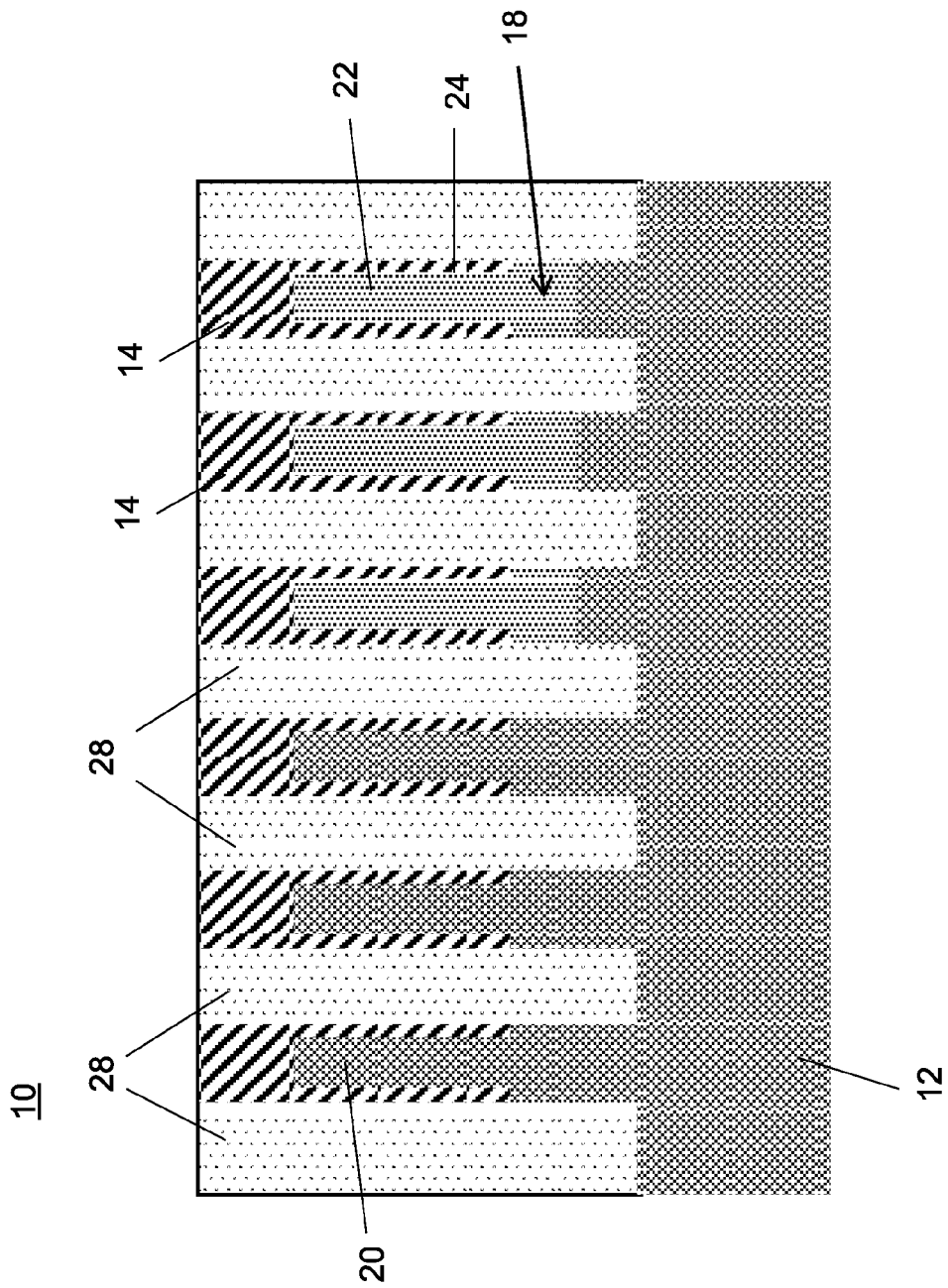
FIG. 7 is a cross-sectional view showing the device of FIG. 6 having a dielectric fill formed in the trenches and in between the encapsulated fins in accordance with an embodiment of the present principles.

Referring to FIG. 7, a dielectric fill 28 is deposited over the device 10 to fill in spaces between fins 20, 22. The dielectric fill 28 may include an oxide material, such as silicon dioxide, although other materials may be employed. The dielectric fill 28 is planarized on the top surface of the device 10 stopping on the pad dielectric 14.

Figure 8:
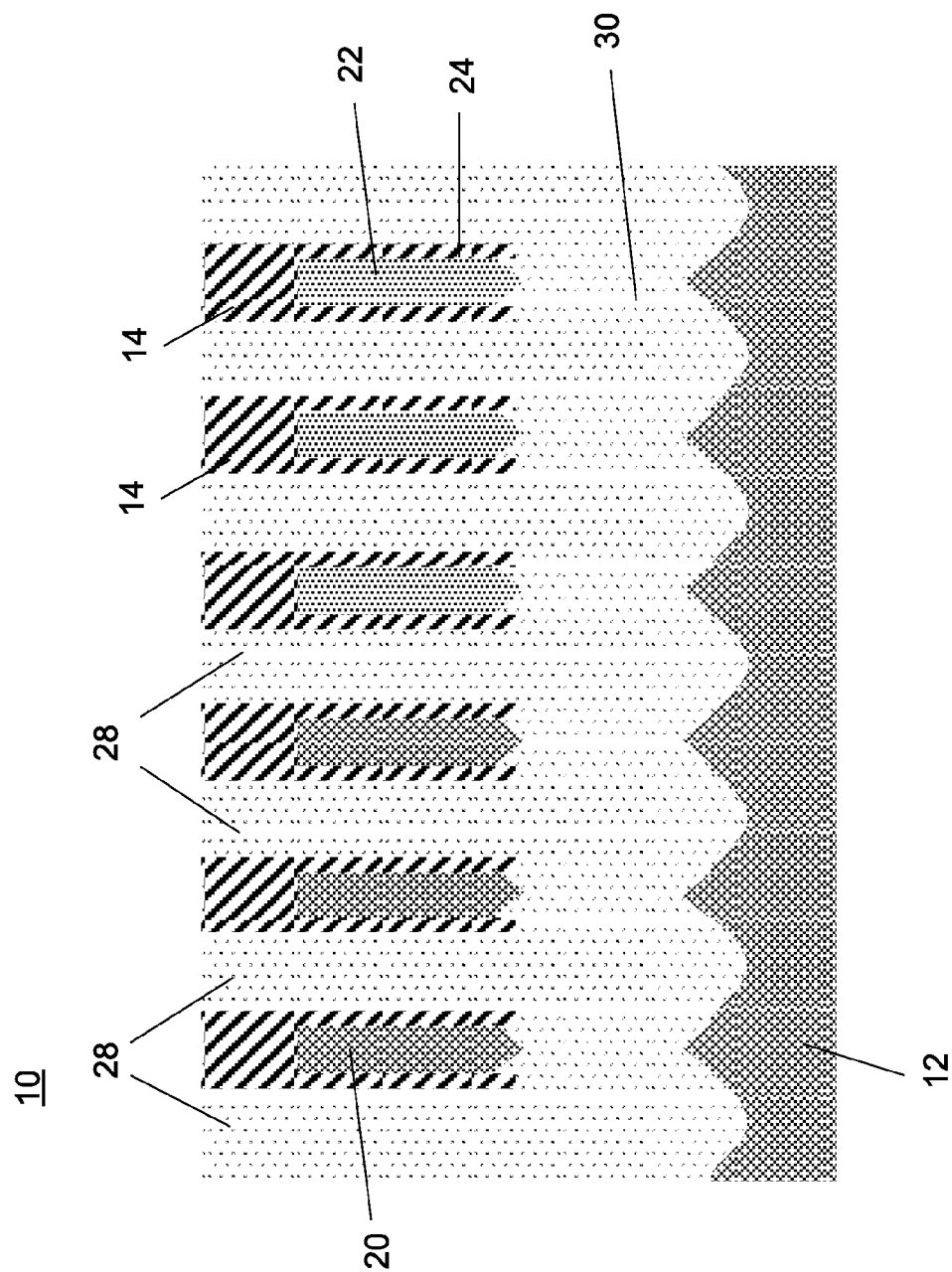
FIG. 8 is a cross-sectional view showing the device of FIG. 7 showing oxidation of the substrate and epitaxially grown material beneath the encapsulated fins in accordance with an embodiment of the present principles.

Referring to FIG. 8, an oxidation process is performed by exposing the device 10 to an oxide environment at elevated temperatures. In one embodiment, the oxidation includes exposure of the device to an oxidation environment containing oxygen or water vapor, at temperatures of between about 600 degrees C. to about 1200 degrees C. for a few seconds to a few hours. Oxidation species, such as, e.g., water steam, diffuse through the dielectric fill 28 and oxidize areas of the substrate 12 and material 18 not protected by pad dielectric 14 and spacers 24. After the oxidation process, the newly formed oxide, due to oxidation, in conjunction of the dielectric fill 28 form a dielectric layer 30 below the fins 20, 22 across the device 10. The dielectric layer 30 will be employed for shallow trench isolation (STI).

Figure 9:
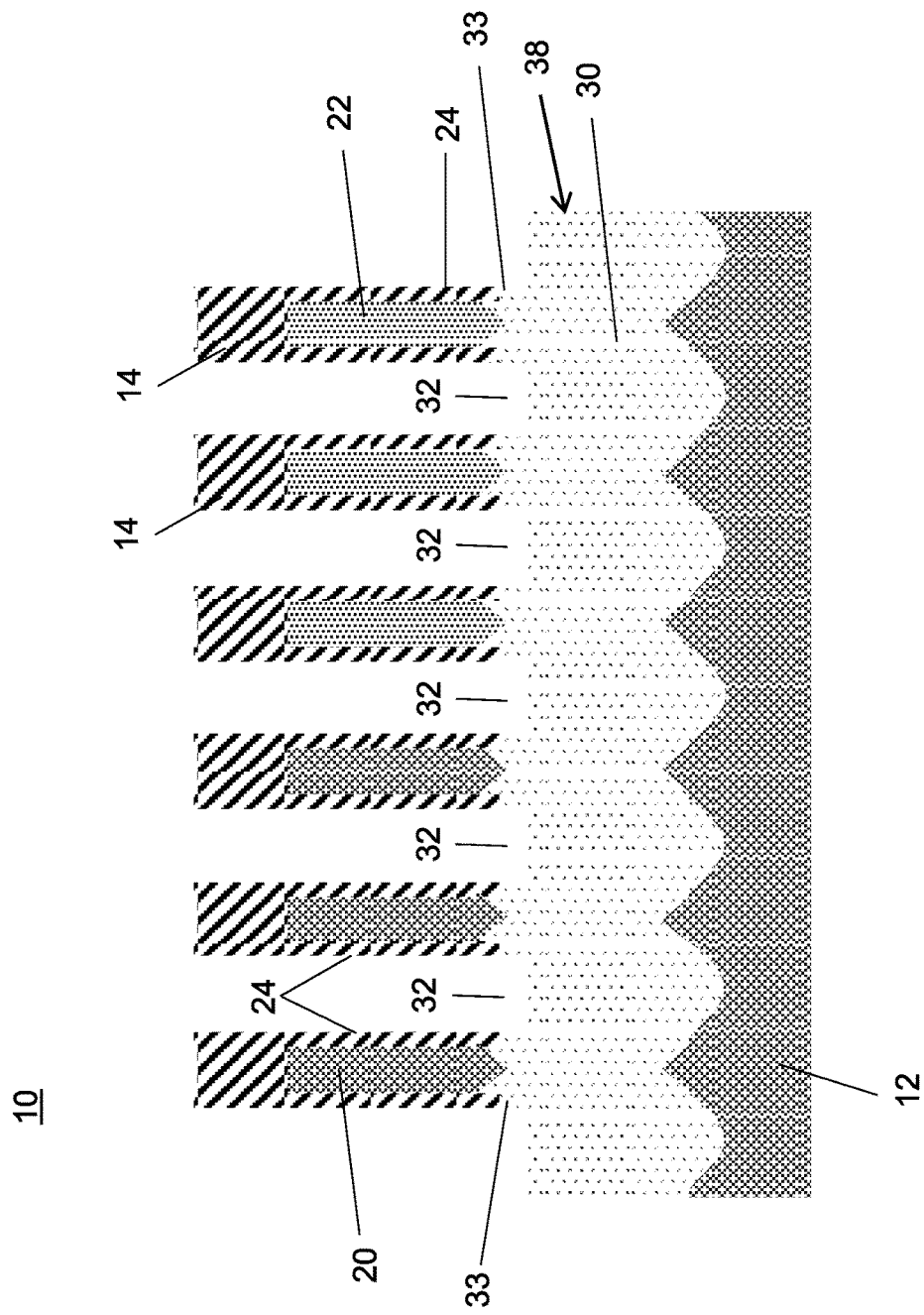
FIG. 9 is a cross-sectional view showing the device of FIG. 8 having trenches etched into an oxide layer beneath the encapsulated fins to form a shallow trench isolation region in accordance with an embodiment of the present principles.

Referring to FIG. 9, a RIE is performed to form trenches 32 between fins 20, 22. This is achieved by etching to remove dielectric fill 28 between fins 20, 22 and continue the etch into the dielectric layer 30. This forms an STI region 38 to isolate the fins 20, 22 from each other and from the substrate 12. The RIE forms pedestals 33 on which the fins 20, 22 are supported.

Figure 10:
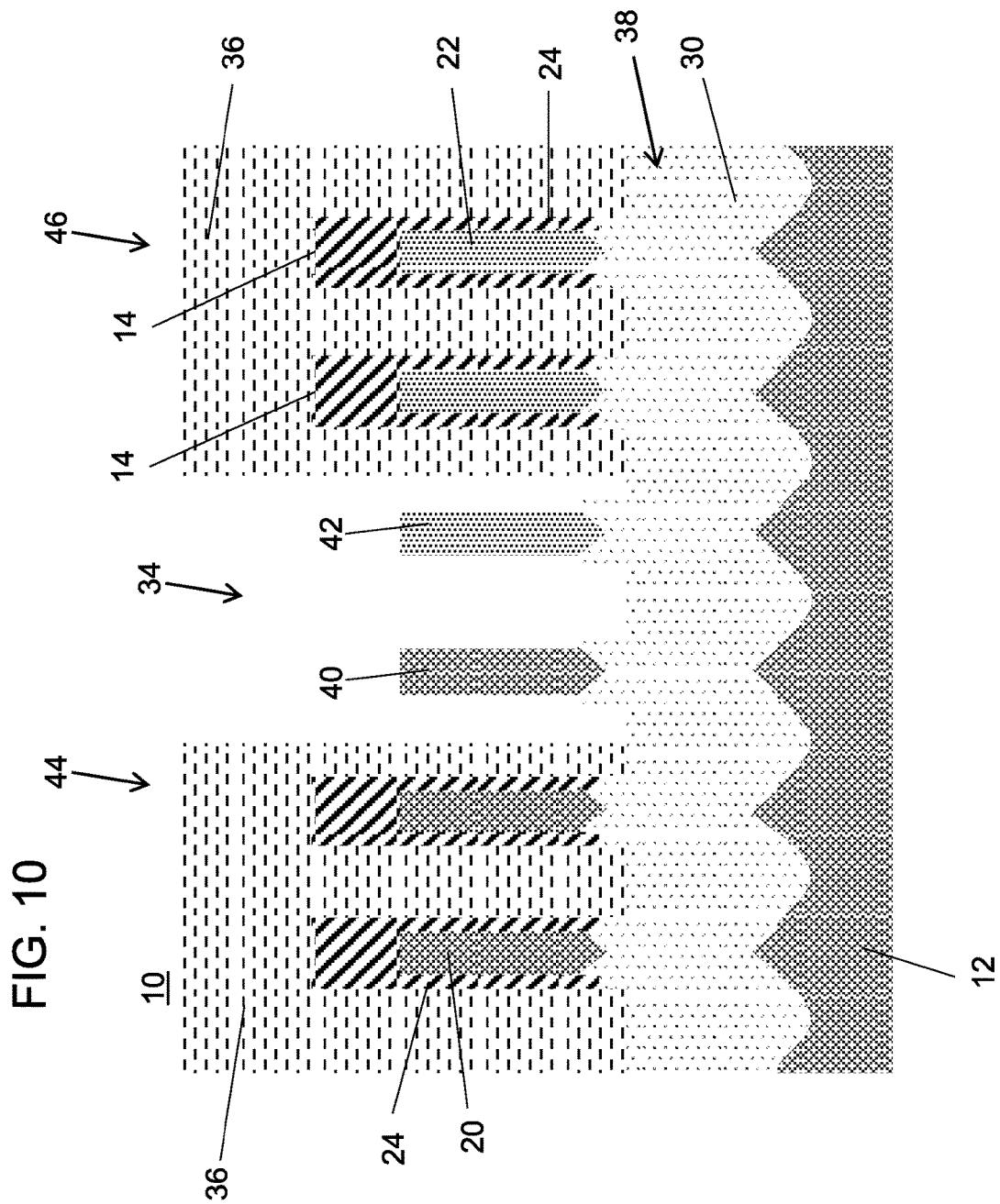
FIG. 10 is a cross-sectional view showing the device of FIG. 9 having fins masked to form an intermediary region and to remove encapsulating materials from the fins in the intermediary region in accordance with an embodiment of the present principles.

Referring to FIG. 10, a fin cut mask 36 is applied to device 10 to cover active fins 20, 22 and expose fins 40, 42 in a region 34 between regions 44 and 46. The mask 36 is patterned using lithography to open up the mask 36 in region 34 to expose fins 40 and 42. The mask 36 may include a resist material, a dielectric material or any other suitable mask materials. Region 44 includes fins 20, and region 46 includes fins 22. The region 34 provides a spacing between regions 44 and 46. Fins 40 and 42 will be converted to dummy fins. The spacers 24 and pad dielectric 14 are removed from the fins 40, 42 by a selective etch process in accordance with the mask 36.

Figure 11:
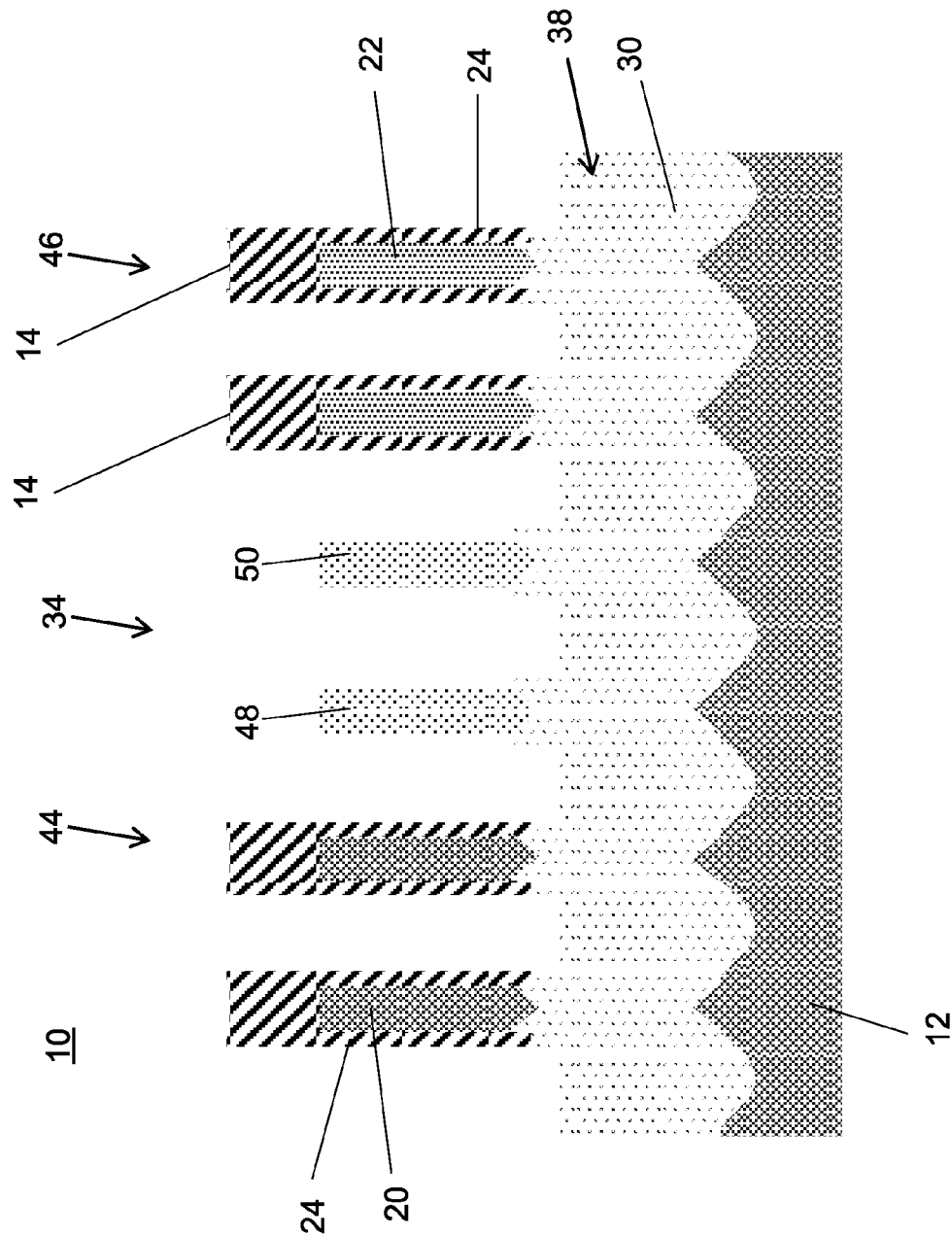
FIG. 11 is a cross-sectional view showing the device of FIG. 10 having dummy fins oxidized in the intermediary region in accordance with an embodiment of the present principles.

Referring to FIG. 11, the mask 36 is removed. The fins 40 and 42 are exposed to an oxidation process to oxidize the exposed fins 40, 42 to convert the fins 40, 42 to oxide fins 48 and 50 (dummy fins). In one embodiment, the oxide fin 48 includes an oxidized Si fin 48 and provides a silicon oxide dummy fin, and the oxide fin 50 includes an oxidized SiGe fin and provides a silicon oxide dummy fin containing germanium.

Figure 12:
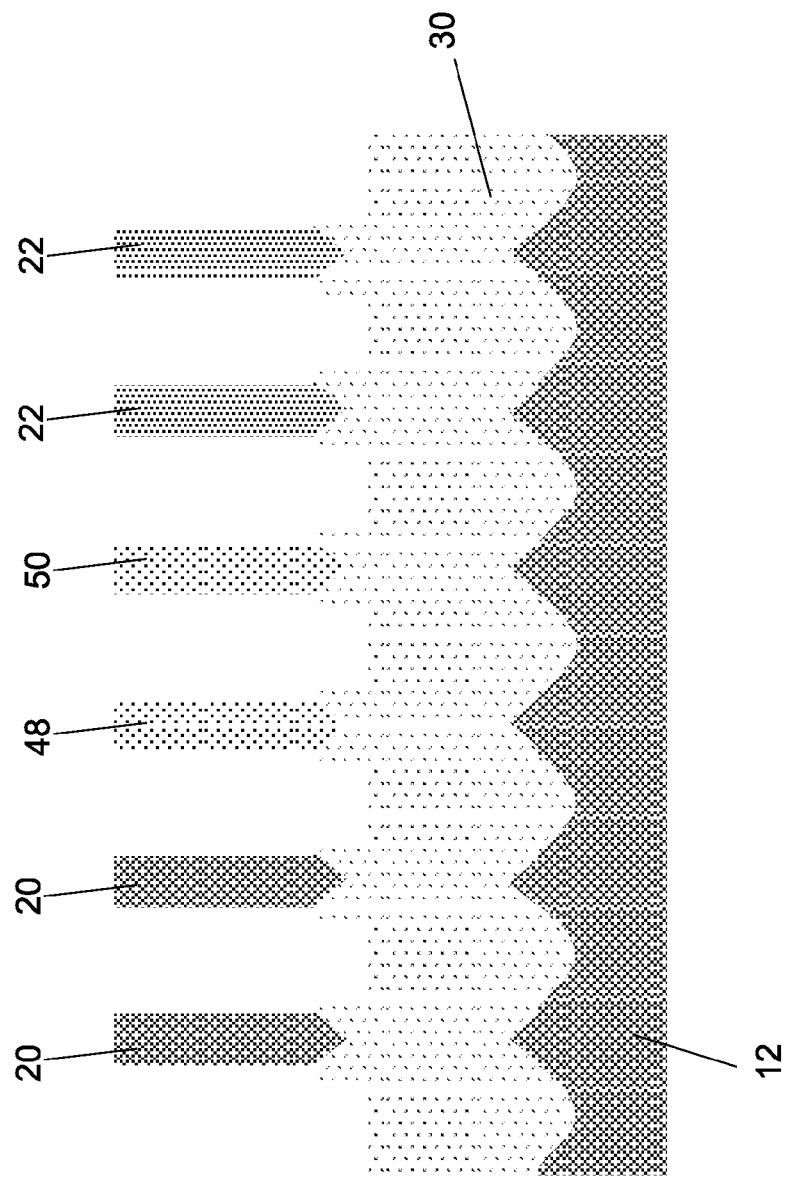
FIG. 12 is a cross-sectional view showing the device of FIG. 11 having masks and encapsulating material removed for the fins in accordance with an embodiment of the present principles.

Referring to FIG. 12, an etch process is performed to selectively remove the pad dielectric 14 and spacers 24 from the remaining fins 20, 22. The device 10 includes fins 20, 22 and dummy fins 48, 50 across the device 10. Since the fins 20, 22, 48, 50 are uniformly disposed across the device 10, no topography issues will arise in subsequent processing. Therefore, all topography related issues such as planarization (e.g., CMP) dishing, etch loading effects, etc. are avoided.

Figure 13:
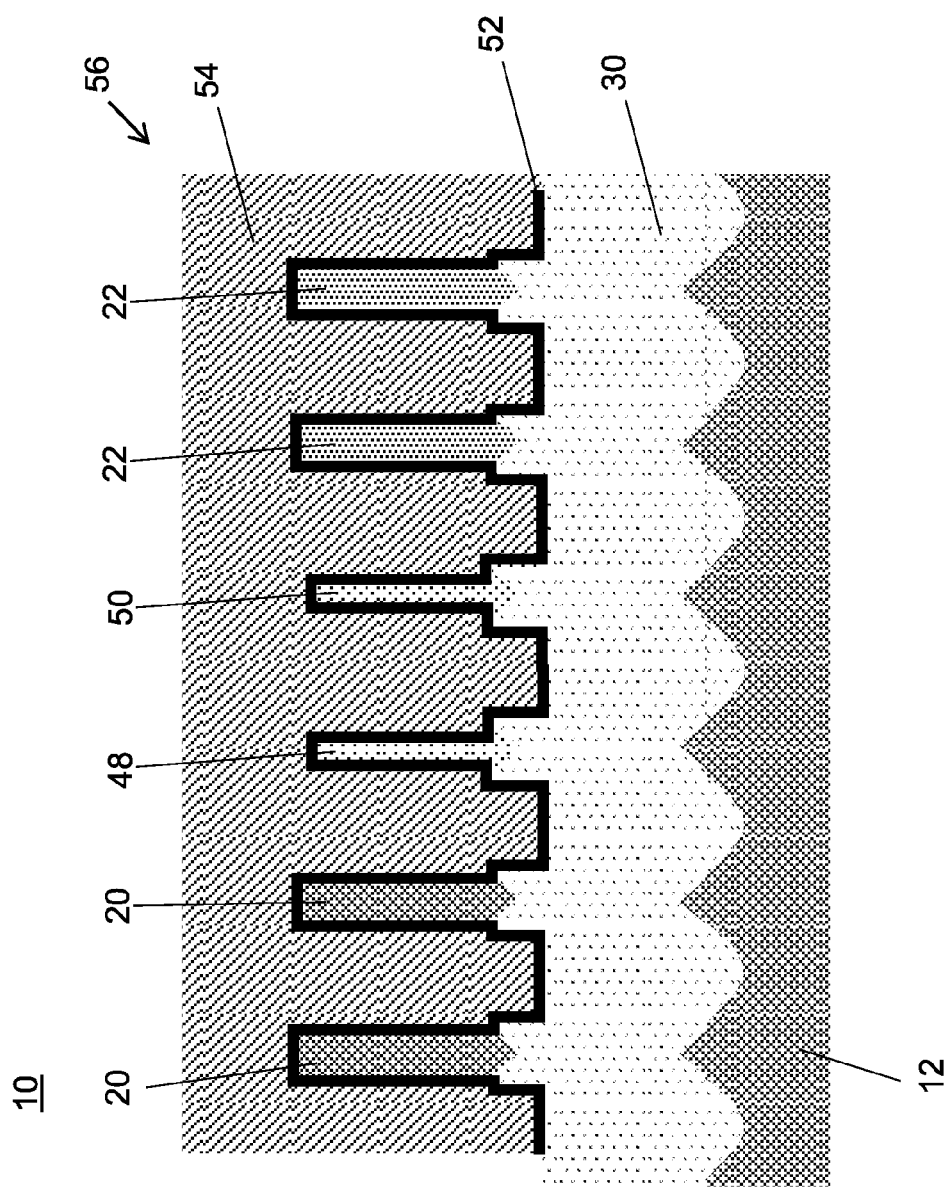
FIG. 13 is a cross-sectional view showing the device of FIG. 12 having a connected gate structure formed over the fins and dummy fins in accordance with an embodiment of the present principles.

Referring to FIG. 13, finFET fabrication continues with the formation of a gate structure 56. The gate structure 56 includes a gate dielectric 52 and a gate conductor 54. In preparation for the formation of the gate dielectric 52, a gate dielectric preclean process may be employed which reduces (thins) the dummy oxide fins 48, 50. Oxide fins 48, 50 and fins 20, 22 have the gate dielectric 52 conformally formed over the fins 20, 22, 48 and 50. The gate dielectric 52 may include an oxide, a nitride, a high dielectric constant (high-K) material or combinations of these or other materials.

The gate conductor 54 includes conductive materials, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In the embodiment shown, the gate structure 56 is formed over the fins 20 and 22 in different areas of the device 10. For example, fins 20 may include Si for NFETs while the fins 22 include SiGe for PFETs. The NFETs and PFETs have a same gate structure (gates for NFETs and PFETs are connected) formed over both device types.

Figure 14:
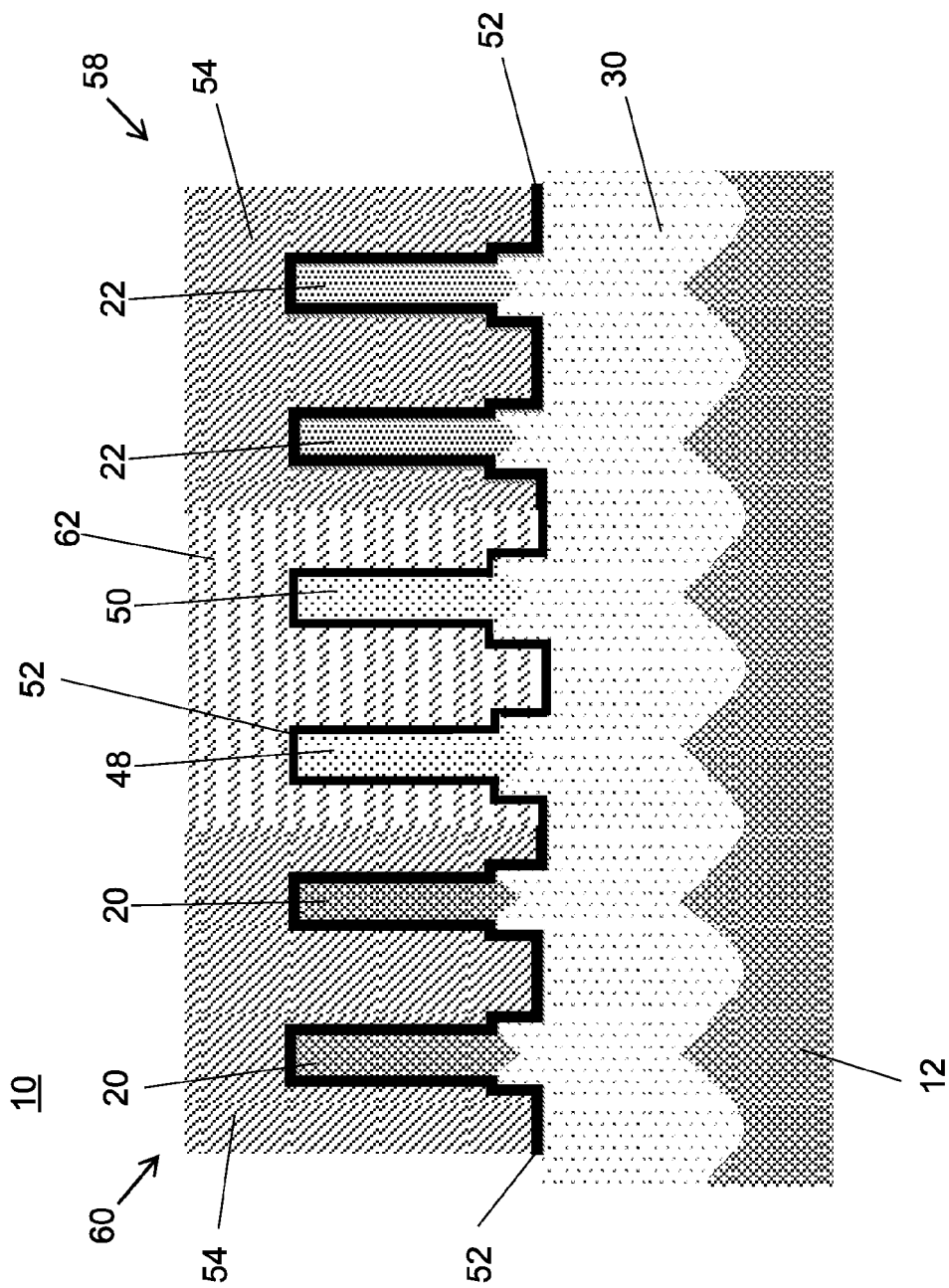
FIG. 14 is a cross-sectional view showing the device of FIG. 12 having separated gate structures formed over the fins and a dielectric cut region formed over the dummy fins in accordance with an embodiment of the present principles.

Referring to FIG. 14, finFET fabrication continues with the formation of gate structures 58 and 60. The gate structures 58, 60 include the gate dielectric 52 and the gate conductor 54. In preparation for the formation of the gate dielectric 52, a gate dielectric preclean process may be employed which reduces (thins) the dummy oxide fins 48, 50. Oxide fins 48, 50 and fins 20, 22 have the gate dielectric 52 conformally formed over the fins 20, 22, 48 and 50. The gate dielectric 52 may include an oxide, a nitride, a high dielectric constant (high-K) material or combinations of these or other materials.

The gate conductor 54 may be deposited and patterned over each device area (e.g., over fins 20 for NFETs and over fins 22 for PFETs). Then, a dielectric material 62 may be deposited and planarized. The dielectric material 62 may include e.g., an oxide. Alternately, the dielectric material 62 may be deposited and patterned followed the gate conductor 54, which can be deposited and planarized. Alternatively, two separate dummy gates may be formed over fins 20 and 22. The dummy fins 20, 22 are covered by dielectric material 62. The dummy gates are then removed and replaced with high-k gate dielectric and gate conductor. In such a case, high-k gate dielectric does not present on dummy fins 48, 50. The dummy fins 48, 50 may be covered by dielectric 62 with an optional dielectric liner (e.g., gate dielectric or silicon nitride) between dummy fins and dielectric 62. The gate conductors 54 may include the same material or different materials for each region (NFET region and PFET region). The conductor 54 may include, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In accordance with the present principles, the dummy oxide fins 48, 50 and oxide isolation layer 30 under the fins may be formed concurrently. In one embodiment, the dummy oxide fins 48, 50 may be formed while oxidizing the layer 30 (in a single step). Dummy oxide fins 48 alleviate topography changes between fins 20, 22 in different regions. By creating a more uniform topology across the device, downstream processing is simplified by eliminating divots or other non-uniformities. In addition, gate patterning, planarization steps and other process steps can be eliminated.

Figure 15:
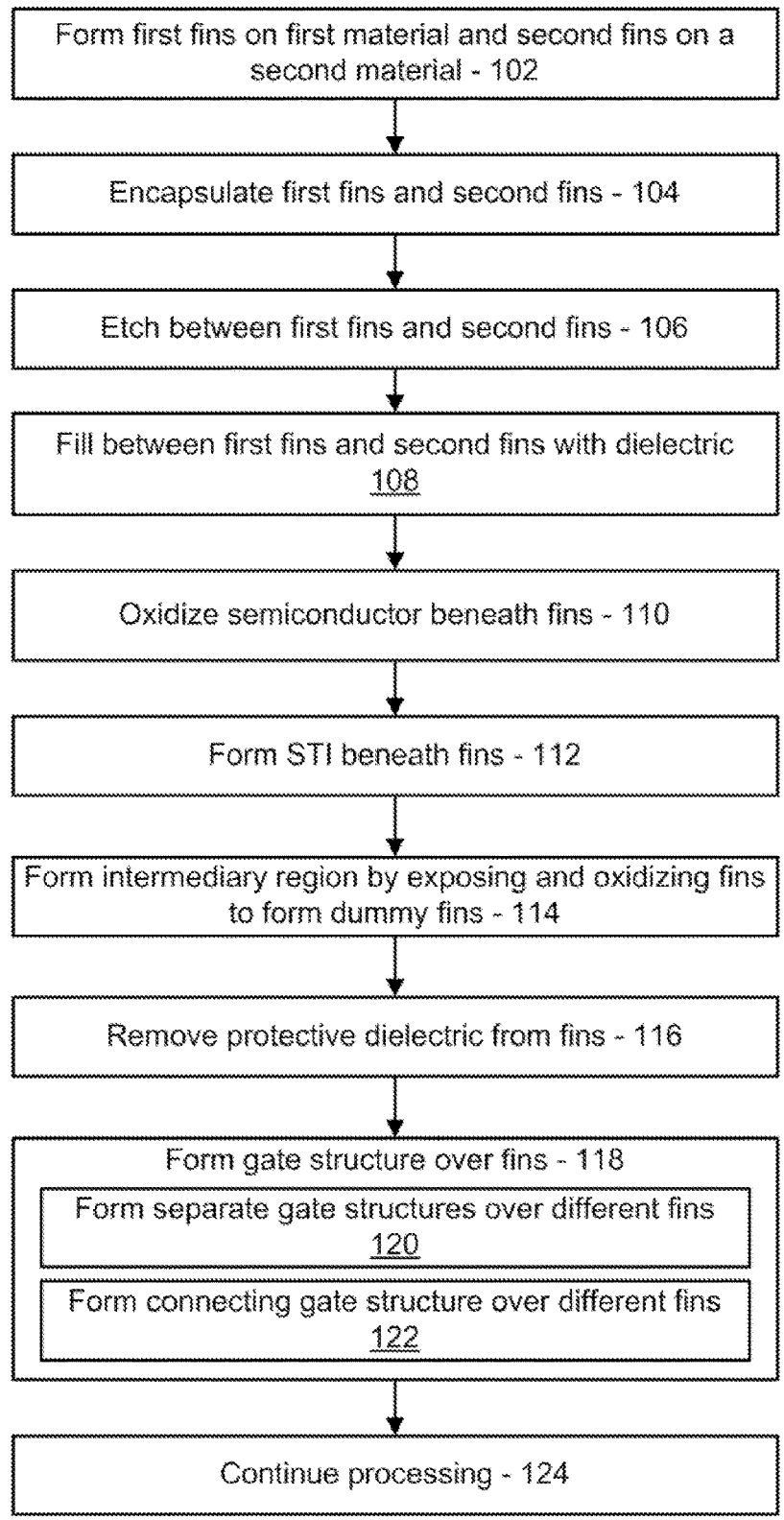
FIG. 15 is a block diagram showing methods for forming semiconductor devices in accordance with embodiments of the present principles.

Referring to FIG. 15, methods for forming semiconductor devices are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, first fins are formed from a first semiconductor material, and second fins are formed from a second semiconductor material. This may include etching a region of a substrate formed from the first material, and growing the second material in the region. Other methods may also be employed. In block 104, the first fins and the second fins are encapsulated with a protective dielectric. This may include a cap layer and spacers.

In block 106, semiconductor material is etched between the first fins and the second fins to form trenches. The fins encapsulated with the protective dielectric can be employed as an etch mask. A pad dielectric cap on top and spacers may be employed for encapsulating the first fins and the second fins with the protective dielectric. The spacers can be formed on the pad dielectric cap and on sidewalls of the first fins and the second fins.

In block 108, the trenches, spaces between the first fins and spaces between the second fins are filled with a dielectric fill. The dielectric fill may be planarized. In block 110, the first semiconductor material below the first fins and the second semiconductor material below the second fins are oxidized by exposing the device to an oxygen environment under elevated temperatures. The first and second fins are protected by the protective dielectric during the oxidation. The substrate and (epitaxially grown material in the substrate are converted to dielectric material and form a dielectric layer beneath the fins. This dielectric layer isolates the fins from the substrate (e.g., similar to a buried dielectric in a semiconductor-on-insulator substrate).

In block 112, before oxidizing fins in the intermediary region, removing the dielectric fill and over-etch to form shallow trench isolation (STI) regions below the first fins and the second fins. This forms pedestals on which the fins are supported. In block 114, fins in an intermediary region between the first fins and the second fins are exposed and oxidized to form dummy fins in the intermediary region to maintain a substantially same topology across the device. In one embodiment, the fins in the intermediary region may be exposed and oxidized along with the formation of the dielectric layer beneath the fins.

In block 116, the protective dielectric is removed from the first fins and the second fins. In block 118, a gate structure may be formed over the first fins and the second fins. In block 120, the gate structure may include a first gate structure over the first fins and a second gate structure over the second fins. In block 122, the gate structure may be formed over the first fins and the second fins to connect the first fins and the second fins. In block 124, processing continues with the formation of interlevel dielectric layers, contacts, metallizations, etc.

Having described preferred embodiments for dummy dielectric fins for finFETS with Si and SiGe channels (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming first fins from a first semiconductor material and second fins from a second semiconductor material, wherein the first semiconductor material is different from the second semiconductor material;
    encapsulating the first fins and the second fins with a protective dielectric;
    etching semiconductor material between the first fins and the second fins to form trenches;
    filling the trenches between the first fins and between the second fins with a dielectric fill;
    oxidizing the first semiconductor material below the first fins and the second semiconductor material below the second fins while the first and second fins are encapsulated by the protective dielectric; and
    oxidizing fins in an intermediary region between the first fins and the second fins thus forming consecutive dummy fins in the intermediary region, the dummy fins stripped of the protective dielectric, to create a uniform topology of all first fins, second fins, and dummy fins with same heights across the device.

2. The method as recited in claim 1, wherein forming the first fins from the first semiconductor material and the second fins from the second semiconductor material includes:
    etching a region of a substrate formed from the first material; and
    growing the second material in the region.

3. The method as recited in claim 1, wherein the first fins and the second fins include a pad dielectric cap on top and wherein encapsulating the first fins and the second fins with the protective dielectric further includes:
    forming spacers on the pad dielectric cap and on sidewalls of the first fins and the second fins.

4. The method as recited in claim 1, further comprising removing the protective dielectric from the first fins and the second fins.

5. The method as recited in claim 4, further comprising forming a gate structure over the first fins and the second fins.

6. The method as recited in claim 5, wherein the gate structure includes a first gate structure over the first fins and a second gate structure over the second fins.

7. The method as recited in claim 5, wherein the gate structure is formed over the first fins and the second fins thus connecting the first fins and the second fins.

8. The method as recited in claim 1, further comprising, before oxidizing fins in the intermediary region, removing the dielectric fill and etching thus forming shallow trench isolation regions below the first fins and the second fins.

9. A method for forming a semiconductor device, comprising:
    etching a portion of a semiconductor substrate, the substrate including a first semiconductor material;
    growing a second semiconductor material in a trench formed by removing the portion of the semiconductor substrate, wherein the first semiconductor material is different from the second semiconductor material;
    etching first fins in the first semiconductor material and second fins in the second semiconductor material in accordance with a dielectric mask;
    forming spacers on sidewalls of the dielectric mask and the first fins and the second fins thus encapsulating the first fins and the second fins with a protective dielectric;
    etching semiconductor material between the first fins and the second fins thus forming trenches;

filling the trenches, between the first fins and between the second fins with a dielectric fill;

oxidizing the first semiconductor material below the first fins and the second semiconductor material below the second fins while the first and second fins are encapsulated by the protective dielectric; and oxidizing fins in an intermediary region between the first fins and the second fins thus forming consecutive dummy fins in the intermediary region, the dummy fins stripped of the protective dielectric, to create a uniform topology of all first fins, second fins, and dummy fins with same heights across the device.

10. The method as recited in claim 9, further comprising removing the protective dielectric from the first fins and the second fins.

11. The method as recited in claim 10, further comprising forming a gate structure over the first fins and the second fins.

12. The method as recited in claim 11, wherein the gate structure includes a first gate structure over the first fins and a second gate structure over the second fins.

13. The method as recited in claim 11, wherein the gate structure is formed over the first fins and the second fins thus connecting the first fins and the second fins.

14. The method as recited in claim 9, further comprising, before oxidizing fins in the intermediary region, removing the dielectric fill and etching thus forming shallow trench isolation regions below the first fins and the second fins.

* * * * *